(12) United States Patent
Hsu et al.

(10) Patent No.: US 12,175,047 B2
(45) Date of Patent: Dec. 24, 2024

(54) CAPACITIVE TOUCHPAD WITH LED DIE POSITIONED TO CORRESPOND WITH ELECTRODE

(71) Applicant: PIXART IMAGING INC., Hsin-Chu (TW)

(72) Inventors: Che-Chia Hsu, Hsin-Chu (TW); Chi-Chieh Liao, Hsin-Chu (TW); Yu-Han Chen, Hsin-Chu (TW)

(73) Assignee: PIXART IMAGING INC., Hsin-Chu (TW)

( * ) Notice: Subject to any disclaimer, the term of this patent is extended or adjusted under 35 U.S.C. 154(b) by 0 days.

(21) Appl. No.: 17/897,722

(22) Filed: Aug. 29, 2022

(65) Prior Publication Data

US 2022/0413654 A1     Dec. 29, 2022

Related U.S. Application Data

(63) Continuation-in-part of application No. 17/401,858, filed on Aug. 13, 2021, now Pat. No. 11,687,187.

(30) Foreign Application Priority Data

Apr. 9, 2021   (CN) .......................... 202110382812.7
Dec. 23, 2021  (CN) .......................... 202111588194.8

(51) Int. Cl.
*G06F 3/044*   (2006.01)
*G06F 3/041*   (2006.01)
*H01L 25/075*  (2006.01)

(52) U.S. Cl.
CPC .......... *G06F 3/0443* (2019.05); *G06F 3/0416* (2013.01); *H01L 25/0753* (2013.01); *G06F 2203/04107* (2013.01)

(58) Field of Classification Search
CPC .............................. G06F 3/0416; G06F 3/0445
See application file for complete search history.

(56) References Cited

U.S. PATENT DOCUMENTS

2009/0244833 A1   10/2009  Imamura
2017/0269749 A1*   9/2017  Bok ..................... H01L 27/156
2018/0059858 A1    3/2018  Tsai
(Continued)

FOREIGN PATENT DOCUMENTS

CN        110362221 A  * 10/2019  ........... G06F 3/0412

OTHER PUBLICATIONS

USPTO, Office Action issued on Aug. 22, 2022 for U.S. Appl. No. 17/401,858.

*Primary Examiner* — Liliana Cerullo
(74) *Attorney, Agent, or Firm* — Li & Cai Intellectual Property (USA) Office

(57) ABSTRACT

A capacitive touchpad is provided, which includes a substrate module, a plurality of sensing electrodes, a plurality of driving electrodes and a plurality of light-emitting diode (LED) dies. The plurality of sensing electrodes and the plurality of driving electrodes form a touch sensing region of the capacitive touchpad, and the touch sensing region is divided into a plurality of sensing units having same areas. Each of the LED dies is arranged in two adjacent ones of the plurality of sensing units, and a position of each of the LED dies corresponds to one of the plurality of driving electrodes, and the LED dies are electrically isolated from the plurality of sensing electrodes and the plurality of driving electrodes.

6 Claims, 13 Drawing Sheets

(56) References Cited

U.S. PATENT DOCUMENTS

| | | |
|---|---|---|
| 2019/0369794 A1 | 12/2019 | Lo et al. |
| 2020/0051958 A1* | 2/2020 | Hu .......................... H01L 27/13 |
| 2020/0167037 A1 | 5/2020 | Lee et al. |
| 2020/0343314 A1* | 10/2020 | Nakamura ........... H01Q 1/2208 |
| 2020/0348774 A1 | 11/2020 | Hsu |
| 2021/0109617 A1* | 4/2021 | Lin .................... H01L 27/1214 |
| 2021/0175282 A1* | 6/2021 | Ikeda .................... G06F 3/0445 |

* cited by examiner

CAPACITIVE TOUCHPAD WITH LED DIE POSITIONED TO CORRESPOND WITH ELECTRODE

CROSS-REFERENCE TO RELATED PATENT APPLICATION

This application is a continuation-in-part of U.S. application Ser. No. 17/401,858, filed on Aug. 13, 2021 and entitled "LIGHTING TOUCHPAD", which claims priority to China Patent Application No. 202110382812.7, filed on Apr. 9, 2021, in People's Republic of China, the contents of which are incorporated herein by reference in their entireties.

This application also claims the benefit of priority to China Patent Applications No. 202111588194.8, filed on Dec. 23, 2021 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a touchpad, and more particularly to a capacitive touchpad.

BACKGROUND OF THE DISCLOSURE

A conventional capacitive touchpad includes a plurality of light-emitting diode (LED) dies arranged on lateral portions thereof and a light guiding plate that is in cooperation with the LED dies for guiding light emitted from the LED dies. However, a touch control effect provided by the lateral portions of the conventional capacitive touchpad can be negatively affected due to multiple LED dies being arranged thereon.

SUMMARY OF THE DISCLOSURE

In response to the above-referenced technical inadequacy, the present disclosure provides a capacitive touchpad to effectively improve on the issues associated with conventional capacitive touchpads.

In one aspect, the present disclosure provides a capacitive touchpad, which includes a substrate module, a sensing electrode layer, a driving electrode layer, a plurality of light-emitting diode (LED) dies, and a controller. The substrate module defines a normal direction. The sensing electrode layer includes a plurality of sensing electrodes formed on the substrate module. The driving electrode layer includes a plurality of driving electrodes formed on the substrate module. The driving electrode layer defines a distribution space extending from the driving electrodes along the normal direction. The LED dies are mounted on the substrate module and are arranged in the distribution space. None of the sensing electrodes are shielded by the LED dies along the normal direction. The controller is electrically coupled to the sensing electrode layer, the driving electrode layer, and the LED dies through the substrate module. When a coupling capacitor is generated from a conductor to at least one of the sensing electrodes, the controller is configured to drive at least one of the LED dies adjacent to the at least one of the sensing electrodes to emit light.

In certain embodiments, the substrate module includes a plurality of substrates arranged along the normal direction, and the sensing electrodes and the LED dies are jointly disposed on one of the substrates that is defined as a first substrate.

In certain embodiments, the capacitive touchpad further includes a protective layer. The protective layer covers the sensing electrodes and the LED dies.

In certain embodiments, a distance between the first substrate and a light emitting end surface of any one of the LED dies is greater than a thickness of any one of the sensing electrodes. The protective layer has a plurality of accommodating slots recessed in a surface thereof facing the first substrate, and the light emitting end surfaces of the LED dies are respectively located in the accommodating slots.

In certain embodiments, the protective layer has a manipulation surface arranged away from the substrate module. The manipulation surface and the light emitting end surface of any one of the LED dies are separated from each other by an interval that is greater than 0 and less than 1 mm.

In certain embodiments, the substrate module includes a plurality of first circuits and a plurality of second circuits. The first circuits and the second circuits are electrically coupled to the controller, the first circuits are respectively connected to the LED dies in a one-to-one manner, and the second circuits are respectively connected to the LED dies in a one-to-one manner.

In certain embodiments, the substrate module includes a plurality of first circuits electrically coupled to the controller and a plurality of second circuits that respectively correspond to the first circuits. The LED dies are divided into a plurality of light emitting groups each having at least two of the LED dies. Any one of the first circuits is connected to each of the LED dies of one of the light emitting groups, and any one of the second circuits is connected to one of the LED dies of each of at least two of the light emitting groups.

In certain embodiments, the driving electrodes are disposed on another one of the substrates other than the first substrate.

In another aspect, the present disclosure provides a capacitive touchpad, which includes a substrate module, a sensing electrode layer, a driving electrode layer, a plurality of light-emitting diode (LED) dies, and a controller. The substrate module defines a normal direction. The sensing electrode layer includes a plurality of sensing electrodes formed on the substrate module. The driving electrode layer includes a plurality of driving electrodes formed on the substrate module. Each of the driving electrodes is formed to surroundingly define a distribution region, and the driving electrode layer defines a distribution space extending from the distribution regions along the normal direction. The LED dies are mounted on the substrate module and are arranged in the distribution space. None of the sensing electrodes are shielded by the LED dies along the normal direction. The controller is electrically coupled to the sensing electrode layer, the driving electrode layer, and the LED dies through the substrate module. When a coupling capacity is generated by a conductor to at least one of the sensing electrodes, the controller is configured to drive at least one of the LED dies adjacent to the at least one of the sensing electrodes to emit light.

In certain embodiments, the substrate module includes a plurality of substrates arranged along the normal direction, and the driving electrodes and the LED dies are jointly disposed on one substrate that is defined as a first substrate. Any one of the LED dies is surrounded by one of the driving electrodes and is located in the distribution region defined by the one of the driving electrodes.

In certain embodiments, the sensing electrodes are disposed on the first substrate, and the capacitive touchpad further includes a protective layer. The protective layer covers the sensing electrodes, the driving electrodes, and the LED dies.

In certain embodiments, a distance between the first substrate and a light emitting end surface of any one of the LED dies is greater than a thickness of any one of the sensing electrodes. The protective layer has a plurality of accommodating slots recessed in a surface thereof facing the first substrate, and the light emitting end surfaces of the LED dies are respectively located in the accommodating slots.

In certain embodiments, the protective layer has a manipulation surface arranged away from the substrate module. The manipulation surface and the light emitting end surface of any one of the LED dies are separated from each other by an interval that is greater than 0 and less than 1 mm.

In certain embodiments, the sensing electrodes are disposed on another one of the substrates that is other than the first substrate and that is defined as a second substrate. The second substrate has a plurality of thru-holes in the plurality of distribution spaces, and the light emitting end surface of any one of the LED dies faces toward one of the plurality of thru-holes.

In certain embodiments, the substrate module includes a plurality of substrates arranged along the normal direction, the driving electrodes are disposed on one of the substrates that is defined as a first substrate, and the LED dies are disposed on another one of the substrates. The first substrate has a plurality of thru-holes respectively corresponding in position to the distribution regions, and the light emitting end surface of any one of the LED dies faces toward one of the thru-holes.

In certain embodiments, the sensing electrodes are disposed on the first substrate, and the capacitive touchpad further includes a protective layer. The protective layer covers the sensing electrodes and the driving electrodes.

In certain embodiments, the substrate module includes a plurality of first circuits and a plurality of second circuits. The first circuits and the second circuits are electrically coupled to the controller, the first circuits are respectively connected to the LED dies in a one-to-one manner, and the second circuits are respectively connected to the LED dies in a one-to-one manner.

In certain embodiments, the substrate module includes a plurality of first circuits electrically coupled to the controller and a plurality of second circuits that respectively correspond to the first circuits. The LED dies are divided into a plurality of light emitting groups each having at least two of the LED dies. Any one of the first circuits is connected to each of the LED dies of one of the light emitting groups, and any one of the second circuits is connected to one of the LED dies of each of at least two of the light emitting groups.

In yet another aspect, the present disclosure provides a capacitive touchpad, which includes a substrate module, a sensing electrode layer, a driving electrode layer, and a plurality of light-emitting diode (LED) dies. The sensing electrode layer includes a plurality of sensing electrodes formed on the substrate module. The driving electrode layer includes a plurality of driving electrodes formed on the substrate module. The plurality of sensing electrodes and the plurality of driving electrodes form a touch sensing region of the capacitive touchpad, and the touch sensing region is divided into a plurality of sensing units having same areas. The plurality of LED dies are mounted on the substrate module. Each of the LED dies is arranged in two adjacent ones of the plurality of sensing units, and a position of each of the LED dies corresponds to a position of one of the plurality of driving electrodes, and the plurality of LED dies are electrically isolated from the plurality of sensing electrodes and the plurality of driving electrodes.

In certain embodiments, the substrate module defines a normal direction, and the driving electrode layer defines a plurality of distribution spaces extending from the plurality of the driving electrodes along the normal direction. The plurality of sensing electrodes define a layout pattern having a plurality of hollow spaces, and the plurality of the LED dies are disposed in the plurality of hollow spaces.

In certain embodiments, the substrate module includes a plurality of substrates arranged along the normal direction, the plurality of sensing electrodes and the LED dies are jointly disposed on one of the plurality of substrates that is defined as a first substrate, and the plurality of the driving electrodes are disposed on another one of the plurality of substrates other than the first substrate.

In certain embodiments, the substrate module defines a normal direction, and each of the plurality of driving electrodes is formed to surroundingly define one of a plurality of distribution regions, and the driving electrode layer defines a plurality of distribution spaces extending from the plurality of distribution regions along the normal direction. The plurality of sensing electrodes define a layout pattern having a plurality of hollow spaces, and the plurality of the LED dies are disposed in the plurality of hollow spaces.

In certain embodiments, the substrate module includes a plurality of substrates arranged along the normal direction, the plurality of sensing electrodes, the plurality of driving electrodes and the plurality of LED dies are jointly disposed on one of the plurality of substrates that is defined as a first substrate, and any one of the plurality of LED dies is surrounded by one of the plurality of driving electrodes and is located in the distribution region defined by the one of the driving electrodes.

In certain embodiments, the substrate module includes a plurality of substrates arranged along the normal direction, the plurality of sensing electrodes and the plurality of driving electrodes are disposed on one of the plurality of substrates that is defined as a first substrate, and the plurality of LED dies are disposed on another one of the plurality of substrates other than the first substrate. The first substrate has a plurality of thru-holes that correspond in position to the plurality of distribution regions, and a light emitting end surface of any one of the LED dies faces toward one of the plurality of thru-holes.

In certain embodiments, the substrate module includes a plurality of substrates arranged along the normal direction, the plurality of sensing electrodes are disposed on one of the plurality of substrates that is defined as a first substrate, and the plurality of driving electrodes and the plurality of LED dies are disposed on another one of the plurality of substrates other than the first substrate. The first substrate has a plurality of thru-holes that correspond in position to the plurality of distribution spaces, and a light emitting end surface of any one of the LED dies faces toward one of the plurality of thru-holes.

In yet another aspect, the present disclosure provides a capacitive touchpad, which includes a substrate module, a sensing electrode layer, a driving electrode layer, and a plurality of light-emitting diode (LED) dies. The sensing electrode layer includes a plurality of sensing electrodes formed on the substrate module. The driving electrode layer includes a plurality of driving electrodes formed on the substrate module. The plurality of sensing electrodes and the plurality of driving electrodes form a touch sensing region of the capacitive touchpad, and the touch sensing region is divided into a plurality of sensing units having same areas. The plurality of LED dies are mounted on the substrate module. Each of the LED dies is arranged in two adjacent ones of the plurality of sensing units, a position of each of the LED dies corresponds to a position of one of the plurality of driving electrodes, and the plurality of LED dies are electrically isolated from the plurality of sensing electrodes and the plurality of driving electrodes.

In certain embodiments, the substrate module defines a normal direction, and the plurality of sensing electrodes define a layout pattern having a plurality of hollow spaces, and the plurality of the LED dies are disposed in the plurality of hollow spaces.

In certain embodiments, the substrate module includes a plurality of substrates arranged along the normal direction, the plurality of driving electrodes and the plurality of LED dies are jointly disposed on one of the plurality of substrates that is defined as a first substrate, and the plurality of sensing electrodes are disposed on another one of the plurality of substrates other than the first substrate.

In certain embodiments, the substrate module defines a normal direction, and the plurality of sensing electrodes define a layout pattern having a plurality of hollow spaces, and the plurality of the LED dies are disposed in the plurality of hollow spaces.

In certain embodiments, the substrate module includes a plurality of substrates arranged along the normal direction, the plurality of sensing electrodes, the plurality of driving electrodes and the plurality of LED dies are jointly disposed on one of the plurality of substrates that is defined as a first substrate, and any one of the plurality of LED dies is surrounded by one of the plurality of driving electrodes and is located in the distribution region defined by the one of the driving electrodes.

In certain embodiments, the substrate module includes a plurality of substrates arranged along the normal direction, the plurality of sensing electrodes and the plurality of driving electrodes are disposed on one of the plurality of substrates that is defined as a first substrate, and the plurality of LED dies are disposed on another one of the plurality of substrates other than the first substrate. The first substrate has a plurality of thru-holes that correspond in position to the plurality of distribution regions, and a light emitting end surface of any one of the LED dies faces toward one of the plurality of thru-holes.

In certain embodiments, the substrate module includes a plurality of substrates arranged along the normal direction, the plurality of sensing electrodes are disposed on one of the plurality of substrates that is defined as a first substrate, the plurality of driving electrodes and the plurality of LED dies are disposed on another one of the plurality of substrates other than the first substrate, the first substrate has a plurality of thru-holes that correspond in position to the plurality of distribution spaces, and a light emitting end surface of any one of the LED dies faces toward one of the plurality of thru-holes.

In yet another aspect, the present disclosure provides a capacitive touchpad, which includes a substrate module, a sensing electrode layer, a driving electrode layer, and a plurality of light-emitting diode (LED) dies. The sensing electrode layer includes a plurality of sensing electrodes formed on the substrate module. The driving electrode layer includes a plurality of driving electrodes formed on the substrate module. The plurality of sensing electrodes and the plurality of driving electrodes form a touch sensing region of the capacitive touchpad, and the touch sensing region is divided into a plurality of sensing units having same areas. The plurality of LED dies are mounted on the substrate module. Each of the LED dies is arranged in one of the plurality of sensing units, a position of each of the LED dies corresponds to a boundary of one of the plurality of driving electrodes and one of the plurality of driving electrodes, and the plurality of LED dies are electrically isolated from the plurality of sensing electrodes and the plurality of driving electrodes.

In certain embodiments, the substrate module defines a normal direction and includes a plurality of substrates arranged along the normal direction, the plurality of LED dies are disposed on one of the plurality of substrates that is defined as a first substrate, and the plurality of sensing electrodes and the plurality of driving electrodes are disposed on another one of the plurality of substrates other than the first substrate.

In yet another aspect, the present disclosure provides a capacitive touchpad, which includes a substrate module, a sensing electrode layer, a driving electrode layer, and a plurality of light-emitting diode (LED) dies. The sensing electrode layer includes a plurality of sensing electrodes formed on the substrate module. The driving electrode layer includes a plurality of driving electrodes formed on the substrate module. The plurality of sensing electrodes and the plurality of driving electrodes form a touch sensing region of the capacitive touchpad, and the touch sensing region is divided into a plurality of sensing units having same areas. The plurality of LED dies are mounted on the substrate module. Each of the LED dies is arranged in adjacent two of the plurality of sensing units, a position of each of the LED dies corresponds to a boundary of one of the plurality of driving electrodes and one of the plurality of driving electrodes, and the plurality of LED dies are electrically isolated from the plurality of sensing electrodes and the plurality of driving electrodes.

Therefore, in the capacitive touchpad provided by the present disclosure, through cooperation of the LED dies and other components of the present disclosure (e.g., each of the LED dies being located in one of the distribution spaces and the LED dies not shielding any one of the sensing electrodes along the normal direction), a touch control effect of the capacitive touchpad provided by the present disclosure can avoid being affected by a position of any one of the LED dies, and subtle changes in partial optical performances of the capacitive touchpad can be provided.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
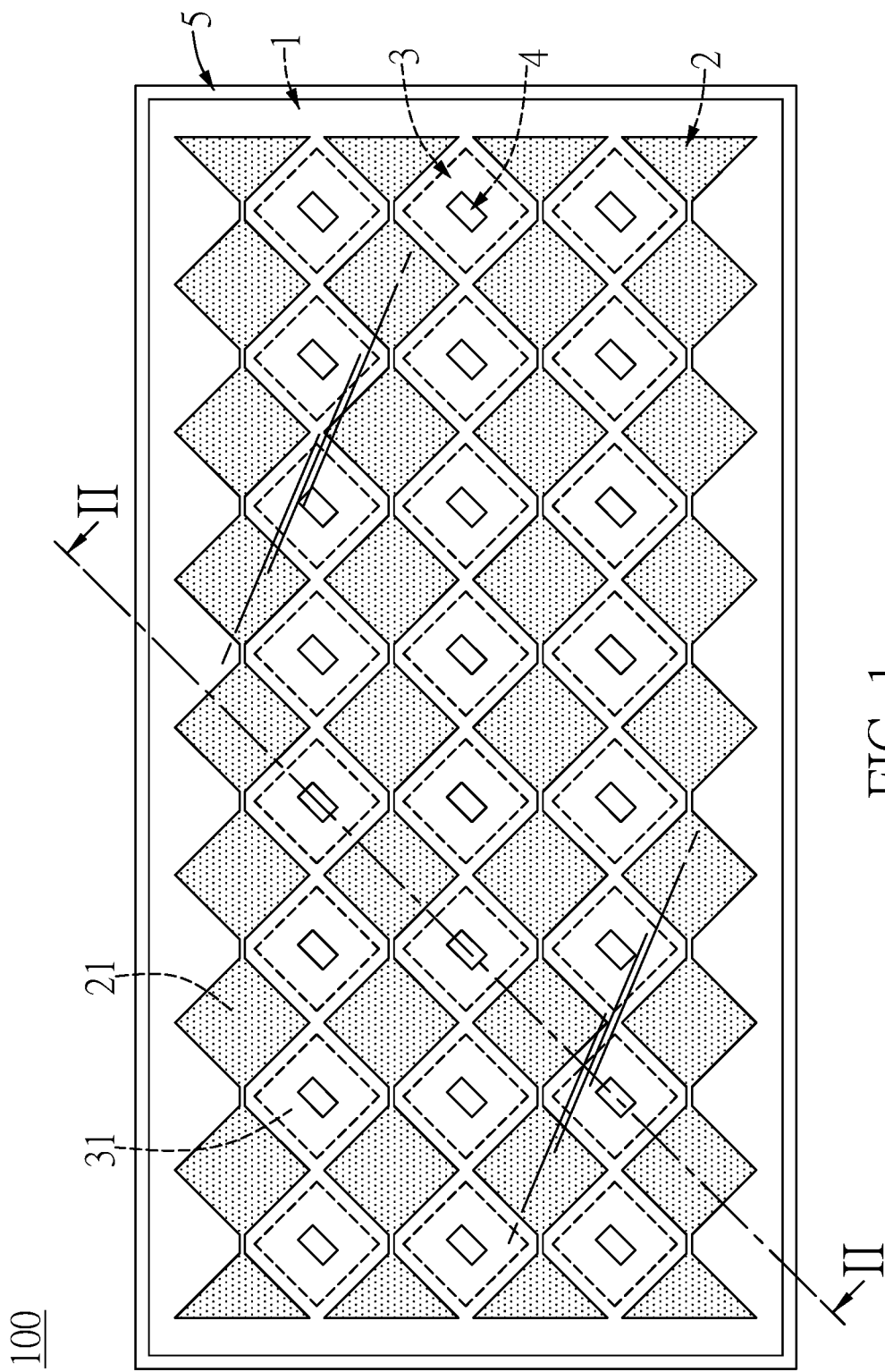
FIG. 1 is a schematic top view of a capacitive touchpad according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
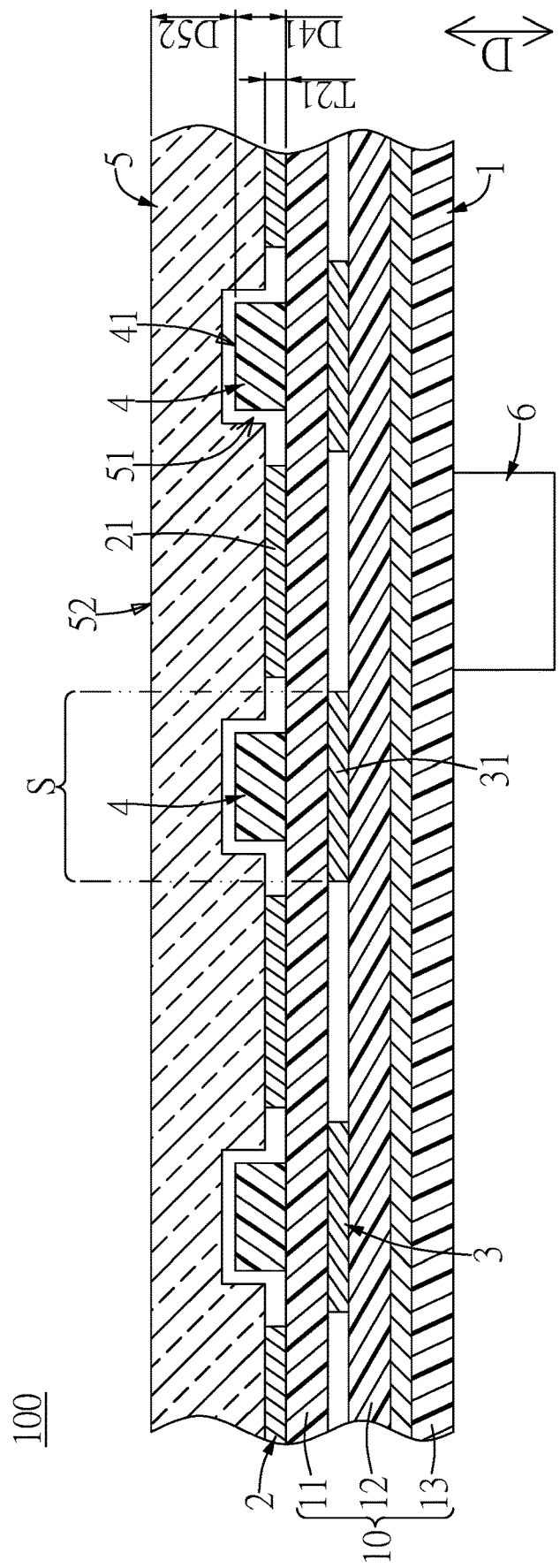
FIG. 2 is a cross-sectional view taken along line II-II of FIG. 1.

Referring to FIG. 1 to FIG. 4, a first embodiment of the present disclosure provides a capacitive touchpad 100. As shown in FIG. 1 and FIG. 2, the capacitive touchpad 100 includes a substrate module 1, a sensing electrode layer 2, a driving electrode layer 3, a plurality of light-emitting diode (LED) dies 4, a protective layer 5, and a controller 6. The sensing electrode layer 2, the driving electrode layer 3, the LED dies 4, and the controller 6 are mounted on the substrate module 1, and the protective layer 5 covers (or is disposed above) the sensing electrode layer 2 and the LED dies 4.

It should be noted that the capacitive touchpad 100 in the present embodiment includes the above components, but the present disclosure is not limited thereto. For example, in other embodiments of the present disclosure not shown in the drawings, the protective layer 5 of the capacitive touchpad 100 can be omitted or can be replaced by other components. The following description describes the structure and connection relationship of each component of the capacitive touchpad 100.

The substrate module 1 having a 2-dimensional plane that defines a normal direction D which perpendicular to the 2-dimensional plane, and includes a plurality of substrates 10 arranged along the normal direction D. In other words, any one of the substrates 10 in the present embodiment is perpendicular to the normal direction D. In order to clearly describe the present embodiment, in a direction away from the protective layer 5, the substrates 10 are defined to sequentially include a first substrate 11, a second substrate 12, and a third substrate 13 that are spaced apart from each other, but the present disclosure is not limited thereto. For example, in other embodiments of the present disclosure not shown in the drawings, the substrate module 1 can be provided without the third substrate 13 or can be provided with an additional substrate (e.g., a fourth substrate).

The sensing electrode layer 2 includes a plurality of sensing electrodes 21 formed on the substrate module 1. The sensing electrodes 21 in the present embodiment are spaced apart from each other and are formed on a surface of the first substrate 11 (e.g., a top surface of the first substrate 11 shown in FIG. 2) adjacent to the protective layer 5, so as to define a layout pattern having a plurality of hollow spaces, but the present disclosure is not limited thereto. For example, in other embodiments of the present disclosure not shown in the drawings, at least one of the sensing electrodes 21 can be formed on another surface of the first substrate 11 (e.g., a bottom surface of the first substrate 11 shown in FIG. 2) away from the protective layer 5.

The driving electrode layer 3 and the sensing electrode layer 2 are respectively located at different height positions in the normal direction D, and the driving electrode layer 3 includes a plurality of driving electrodes 31 formed on the substrate module 1. The driving electrodes 31 are disposed on another one of the substrates 10 other than the first substrate 11. The driving electrodes 31 in the present embodiment are spaced apart from each other and are formed on a surface of the second substrate 12 (e.g., a top surface of the second substrate 12 shown in FIG. 2) adjacent to the first substrate 11, but the present disclosure is not limited thereto.

For example, in other embodiments of the present disclosure not shown in the drawings, at least one of the driving electrodes 31 can be formed on another surface of the second substrate 12 (e.g., a bottom surface of the second substrate 12 shown in FIG. 2) away from the first substrate 11; or, at least one of the driving electrodes 31 can be formed on the another surface of the first substrate 11 (e.g., the bottom surface of the first substrate 11 shown in FIG. 2) away from the protective layer 5.

Specifically, the driving electrode layer 3 defines a plurality of distribution spaces S extending from the driving electrodes 31 along the normal direction D, and the sensing electrodes 21 in the present embodiment are arranged outside of the plurality of distribution spaces S. In other words, a projection region defined by orthogonally projecting the sensing electrodes 21 onto the second substrate 12 surrounds an outer side of the driving electrodes 31, but the present disclosure is not limited thereto. For example, in other embodiments of the present disclosure not shown in the drawings, a peripheral portion of at least one of the sensing electrodes 21 can be located in the distribution space S.

The LED dies 4 and the sensing electrodes 21 are jointly disposed on one of the substrates 10 (e.g., the first substrate 11), each of the LED dies 4 is located in one of the distribution spaces S and disposed in the hollow spaces of the layout pattern that is defined by the sensing electrodes 21. In other words, none of the sensing electrodes 21 are shielded by the LED dies 4 along the normal direction D. In other words, any one of the LED dies 4 in the present embodiment corresponds in position to one of the driving electrodes 31 along the normal direction D.

Moreover, a distance D41 between the first substrate 11 and a light emitting end surface 41 of any one of the LED dies 4 (e.g., a top surface of any one of the LED dies 4 shown in FIG. 2) is greater than a thickness T21 of any one of the sensing electrodes 21. Specifically, a difference between the distance D41 and the thickness T21 can be greater than 0 and less than 1 mm, but the present disclosure is not limited thereto.

The protective layer 5 in the present embodiment is a board detachably disposed on the substrate module 1, and the protective layer 5 covers the sensing electrodes 21 and the LED dies 4. The protective layer 5 has a plurality of accommodating slots 51 recessed in a surface thereof (e.g., a bottom surface of the protective layer 5 shown in FIG. 2) facing the substrate module 1 (e.g., the first substrate 11), and the light emitting end surfaces 41 of the LED dies 4 are respectively located in the accommodating slots 51.

Moreover, the protective layer 5 has a manipulation surface 52 (e.g., a top surface of the protective layer 5 shown in FIG. 2) arranged away from the substrate module 1. The manipulation surface 52 and the light emitting end surface 41 of any one of the LED dies 4 are preferably separated from each other by an interval D52 that is greater than 0 and less than 1 mm, but the present disclosure is not limited thereto.

The controller 6 in the present embodiment is mounted on a surface of the third substrate 13 (e.g., a bottom surface of the third substrate 13 shown in FIG. 2) away from the protective layer 5, but the present disclosure is not limited thereto. For example, in other embodiments of the present disclosure not shown in the drawings, the controller 6 can be mounted on any one of the substrates 10 of the substrate module 1, or can be mounted on other components different from the substrate module 1.

Moreover, the controller 6 is electrically coupled to the sensing electrode layer 2, the driving electrode layer 3, and the LED dies 4 through the substrate module 1. Specifically, when a coupling capacitor is generated from a conductor (e.g., a stylus or a finger) to at least one of the sensing electrodes 21, the controller 6 can be configured to drive at least one of the LED dies 4 adjacent to the at least one of the sensing electrodes 21 to emit light. Specifically, a quantity of the at least one of the LED dies 4 driven by the controller 6 can be adjusted or changed according to design requirements.

Accordingly, through structural cooperation of the LED dies 4 and other components of the present embodiment (e.g., each of the LED dies 4 being located in one of the distribution spaces S and the LED dies 4 not shielding any one of the sensing electrodes 21 along the normal direction D), a touch control effect of the capacitive touchpad 100 in the present embodiment can avoid being affected by a position of any one of the LED dies 4, and subtle changes in partial optical performances of the capacitive touchpad can be provided.

It should be noted that an electrical path that electrically connects the substrate module 1, the LED dies 4, and the controller 6 can be adjusted or changed according to design requirements. In order to clearly describe the present embodiment, the following description takes the electrical path shown in FIG. 3 and FIG. 4 as an example, but the present disclosure is not limited thereto.

Figure 3:
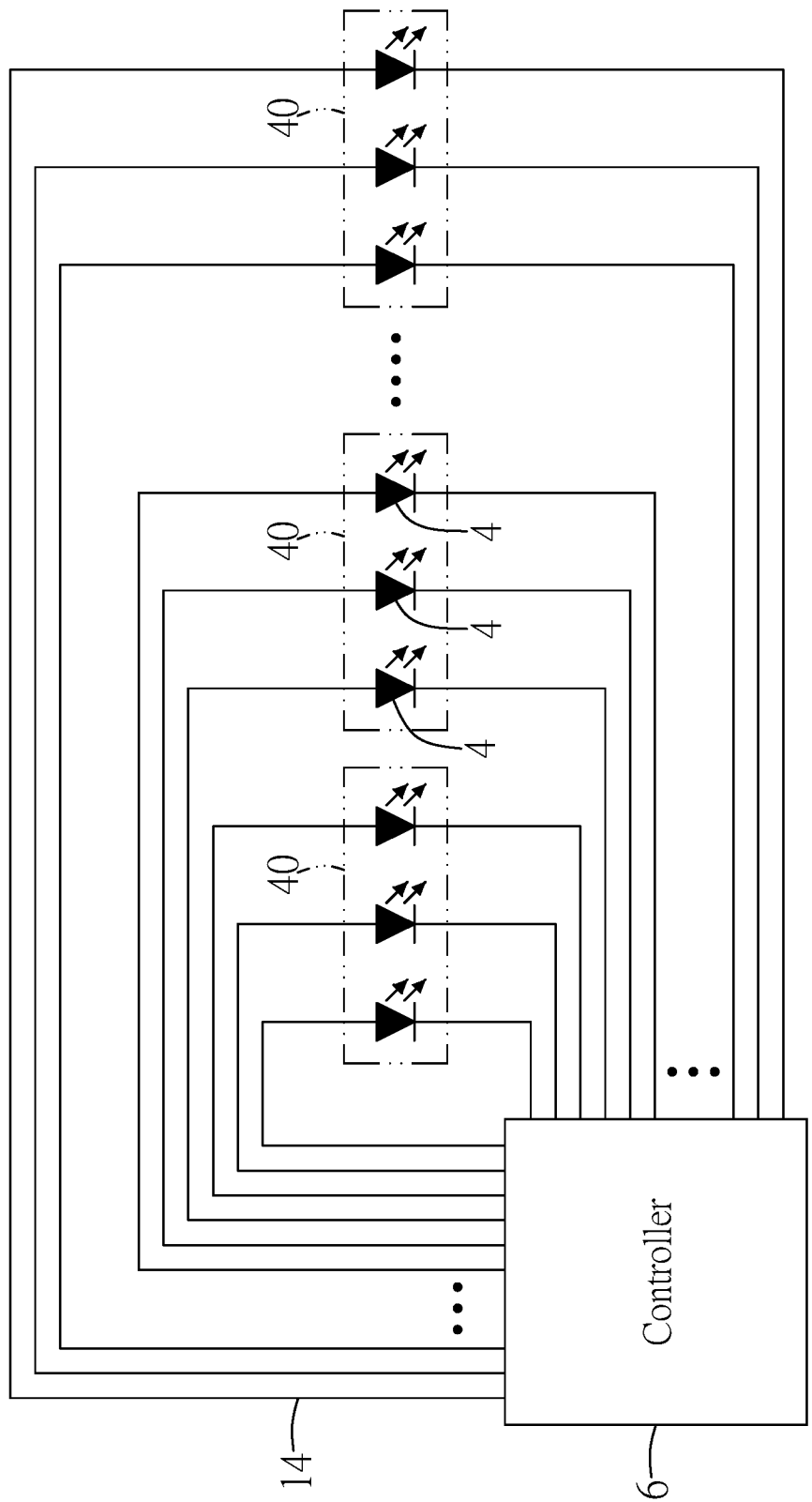
FIG. 3 is a partial circuit diagram of the capacitive touchpad according to the first embodiment of the present disclosure.

Specifically, as shown in FIG. 1 to FIG. 3, the substrate module 1 includes a plurality of first circuits 14 and a plurality of second circuits 15. The first circuits 14 and the second circuits 15 are electrically coupled to the controller 6, the first circuits 14 are respectively connected to the LED dies 4 in a one-to-one manner, and the second circuits 15 are respectively connected to the LED dies 4 in a one-to-one manner. Accordingly, each of the LED dies 4 can be independently driven by the controller 6 to emit light.

Figure 4:
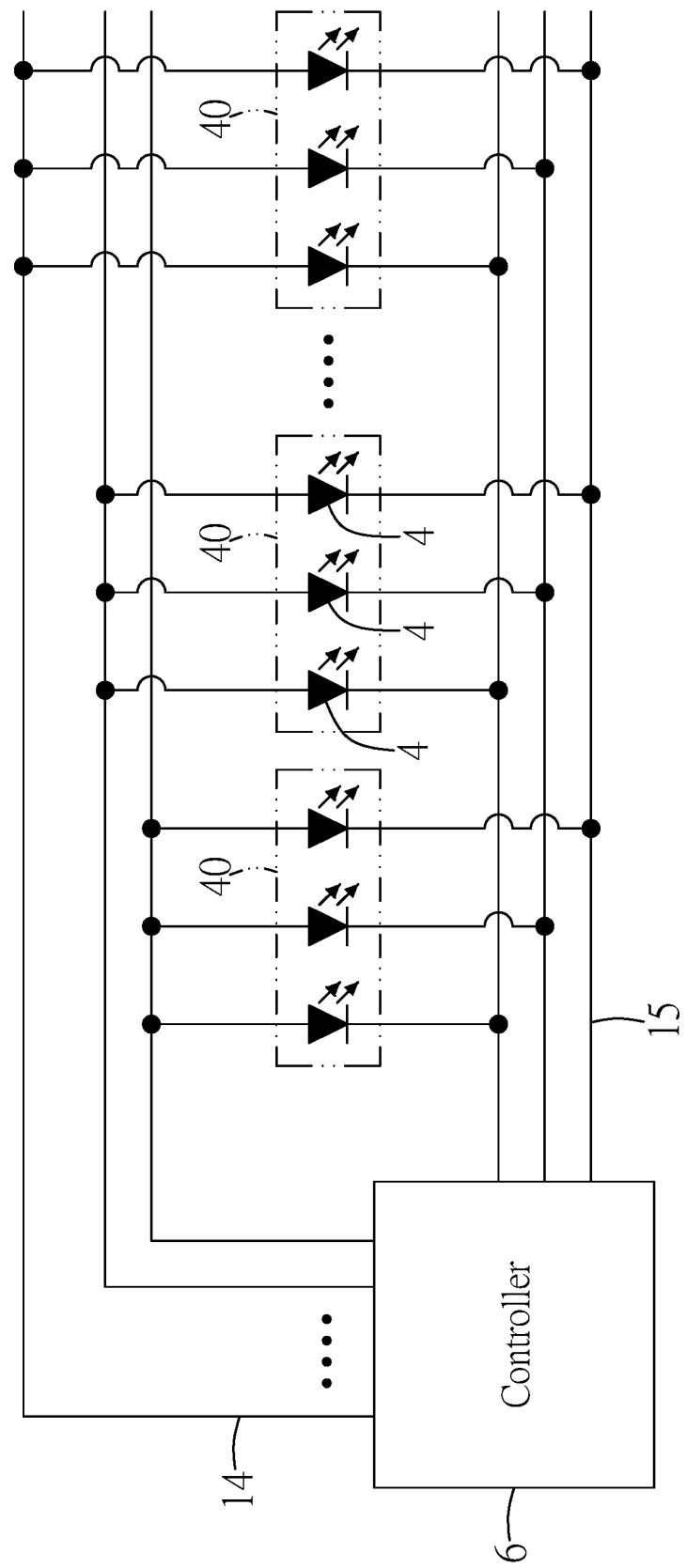
FIG. 4 is a partial circuit diagram of the capacitive touchpad in another configuration according to the first embodiment of the present disclosure.

In addition, as shown in FIG. 1, FIG. 2, and FIG. 4, the substrate module 1 can include a plurality of first circuits 14 electrically coupled to the controller 6 and a plurality of second circuits 15 that respectively correspond to the first circuits 14. The LED dies 4 are divided into a plurality of light emitting groups 40, and the light emitting groups 40 include at least two of the LED dies 4. Moreover, any one of the first circuits 14 is connected to a positive electrode or a negative electrode of each of the LED dies 4 of one of the light emitting groups 40, and any one of the second circuits 15 is connected to a positive electrode or a negative electrode (an anode electrode or a cathode electrode) of one of the LED dies 4 of each of at least two of the light emitting groups 40. Accordingly, one of the first circuits 14 and one of the second circuits 15 can jointly control light emission of connected one of the LED dies 4, such that each of the LED dies 4 can be independently driven by the controller 6 to emit light.

Second Embodiment

Figure 5:
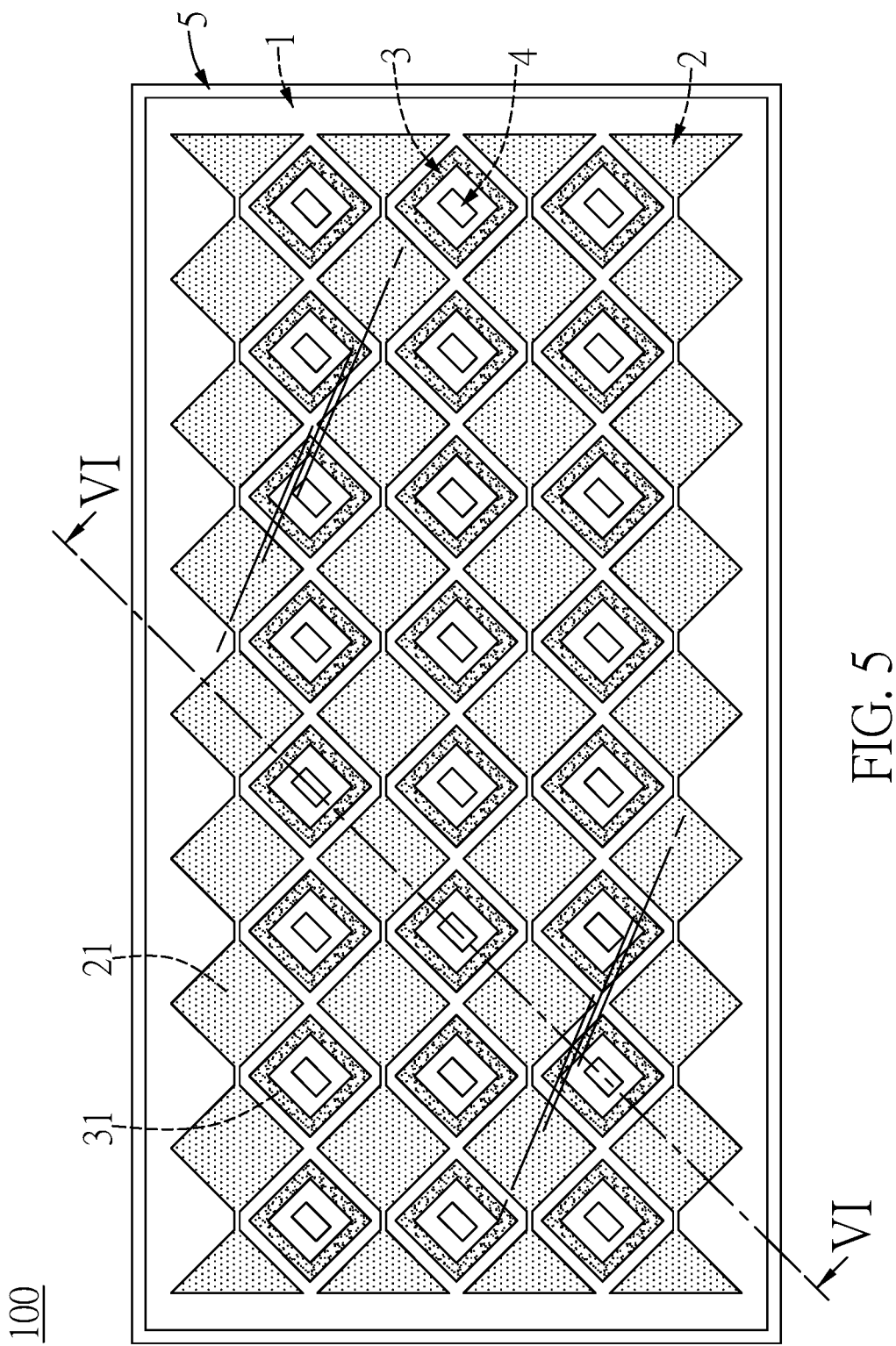
FIG. 5 is a schematic top view of the capacitive touchpad according to a second embodiment of the present disclosure.
Figure 6:
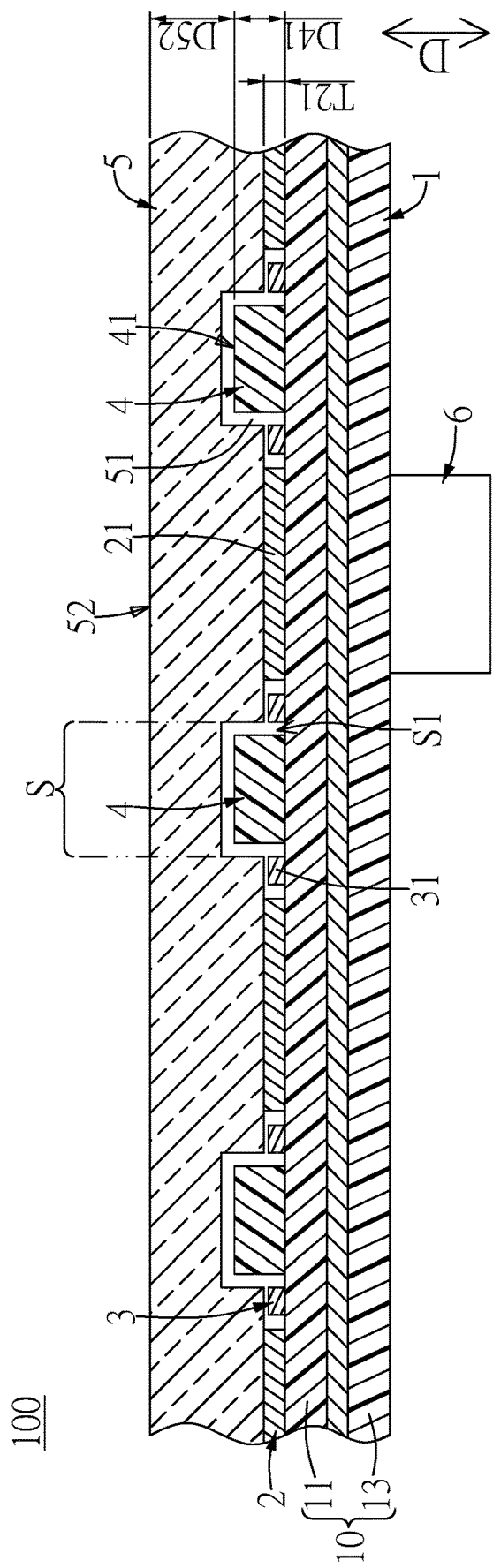
FIG. 6 is a cross-sectional view taken along line VI-VI of FIG. 5.

Referring to FIG. 5 and FIG. 6, a second embodiment of the present disclosure is similar to the first embodiment of the present disclosure. For the sake of brevity, descriptions of the same components in the first and second embodiments of the present disclosure will be omitted herein, and the following description only discloses different features between the first and second embodiments.

In the present embodiment, the sensing electrodes 21, the driving electrodes 31, and the LED dies 4 are jointly disposed on one of the substrates 10 (e.g., the first substrate 11) of the substrate module 1, and the protective layer 5 covers the sensing electrodes 21, the driving electrodes 31, and the LED dies 4. In other words, the substrate module 1 in the present embodiment can be provided without the second substrate 12 disclosed in the first embodiment.

Specifically, each of the driving electrodes 31 is formed to surroundingly define one of a plurality of distribution regions 51. In the present embodiment, any one of the driving electrodes 31 is in an annular shape or a U-shape, so that an inner edge of any one of the driving electrodes 31 can surround a corresponding one of the distribution regions 51. For example, any one of the driving electrodes 31 has a thru-hole that is defined as one of the distribution regions 51.

Moreover, the driving electrode layer 3 defines a plurality of distribution spaces S extending from the distribution regions 51 along the normal direction D. Each of the LED dies 4 is arranged in one of the distribution spaces S, and none of the sensing electrodes 21 are shielded by the LED dies along the normal direction D. In other words, any one of the LED dies 4 is surrounded by one of the driving electrodes 31 and is located in the distribution region 51 defined by the one of the driving electrodes 31. For instance, each of the driving electrodes 31 forms a rectangular frame, and any one of the LED dies can be disposed within a hollow portion defined by the rectangular frame, such that the rectangular frame can surround the corresponding LED die 4.

Accordingly, due to the structural design of each of the driving electrodes 31, the sensing electrodes 21, the driving electrodes 31, and the LED dies 4 in the capacitive touchpad 100 of the present embodiment can be jointly disposed on the same substrate 10, so that a thickness of the capacitive touchpad 100 can be effectively reduced.

Third Embodiment

Figure 7:
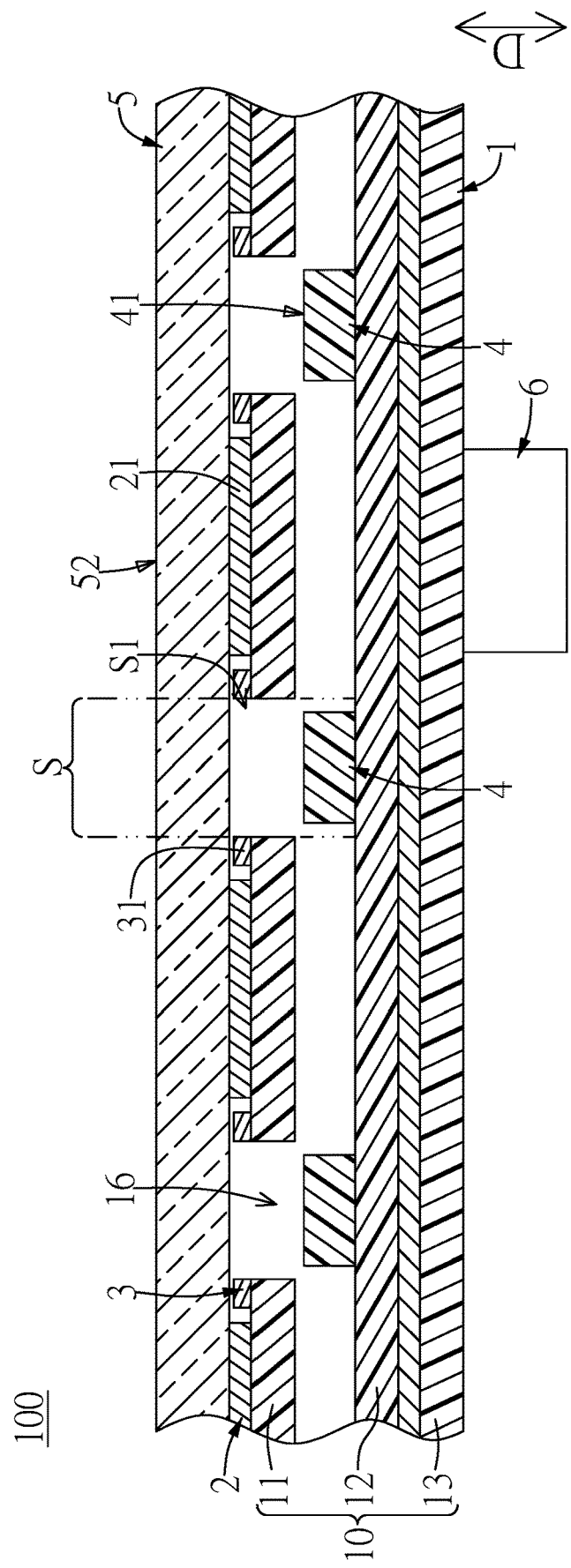
FIG. 7 is a cross-sectional view showing a part of the capacitive touchpad according to a third embodiment of the present disclosure.

Referring to FIG. 7, a third embodiment of the present disclosure is similar to the second embodiment of the present disclosure. For the sake of brevity, descriptions of the same components in the second and third embodiments of the present disclosure will be omitted herein, and the following description only discloses different features between the second and third embodiments.

In the present embodiment, the driving electrodes 31 and the sensing electrodes 21 are jointly disposed on one of the substrates 10 of the substrate module 1 (e.g., the first substrate 11), and the LED dies 4 are disposed on another one of the substrates 10 of the substrate module 1 (e.g., the second substrate 12). In other words, the substrate module 1 in the present embodiment can include the second substrate 12 disclosed in the first embodiment.

Specifically, the protective layer 5 covers (or is disposed on) the sensing electrodes 21 and the driving electrodes 31. The first substrate 11 has a plurality of thru-holes 16 that respectively corresponding in position to the distribution regions 51, and the light emitting end surface 41 of any one of the LED dies 4 faces toward one of the thru-holes 16. Accordingly, a surface of the protective layer 5 (e.g., a bottom surface of the protective layer 5 shown in FIG. 7) facing the substrate module 1 (e.g., the first substrate 11) can be flat, thereby effectively reducing difficulty of manufacturing the protective layer 5.

Fourth Embodiment

Figure 8:
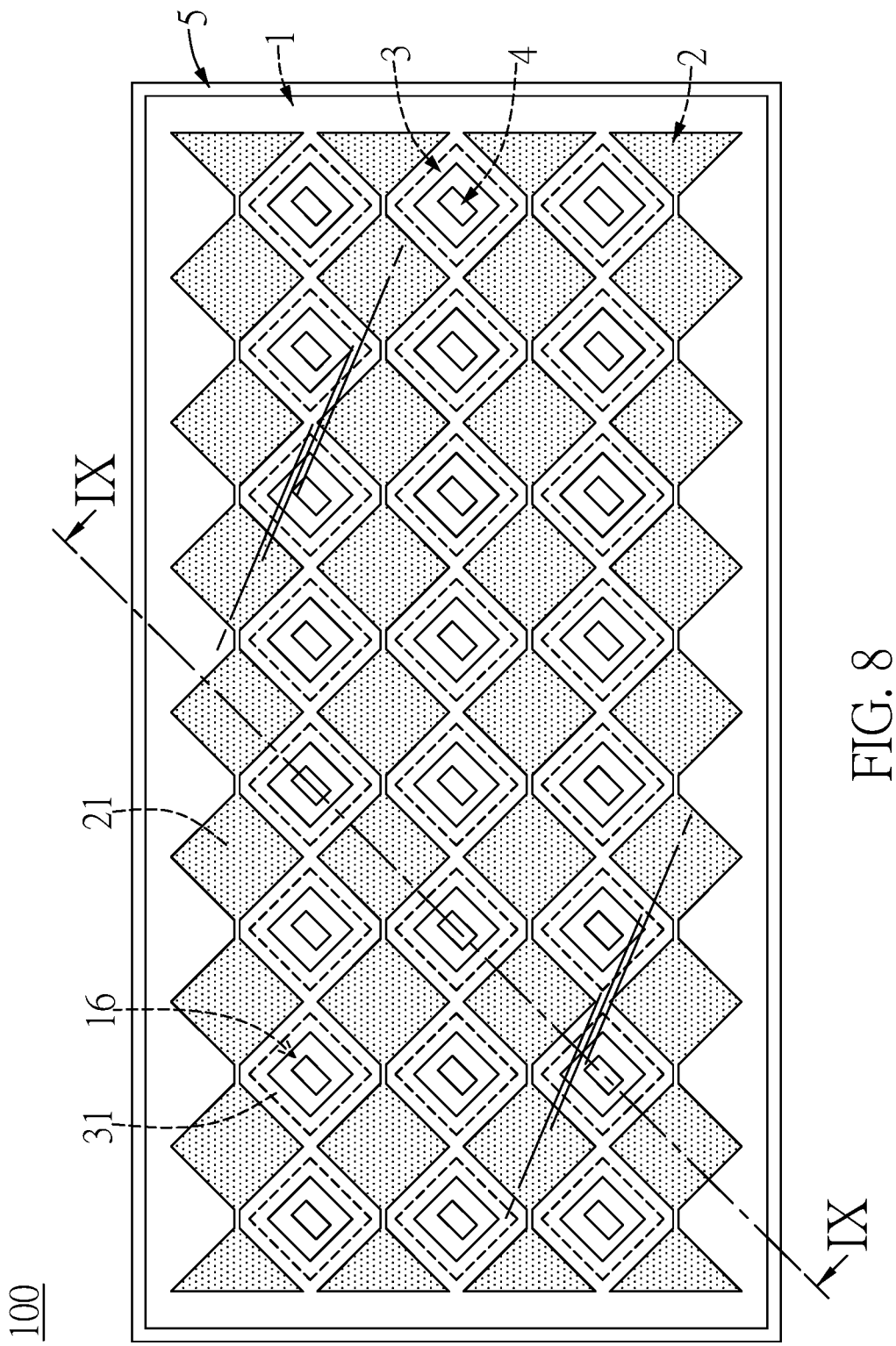
FIG. 8 is a schematic top view of the capacitive touchpad according to a fourth embodiment of the present disclosure.
Figure 9:
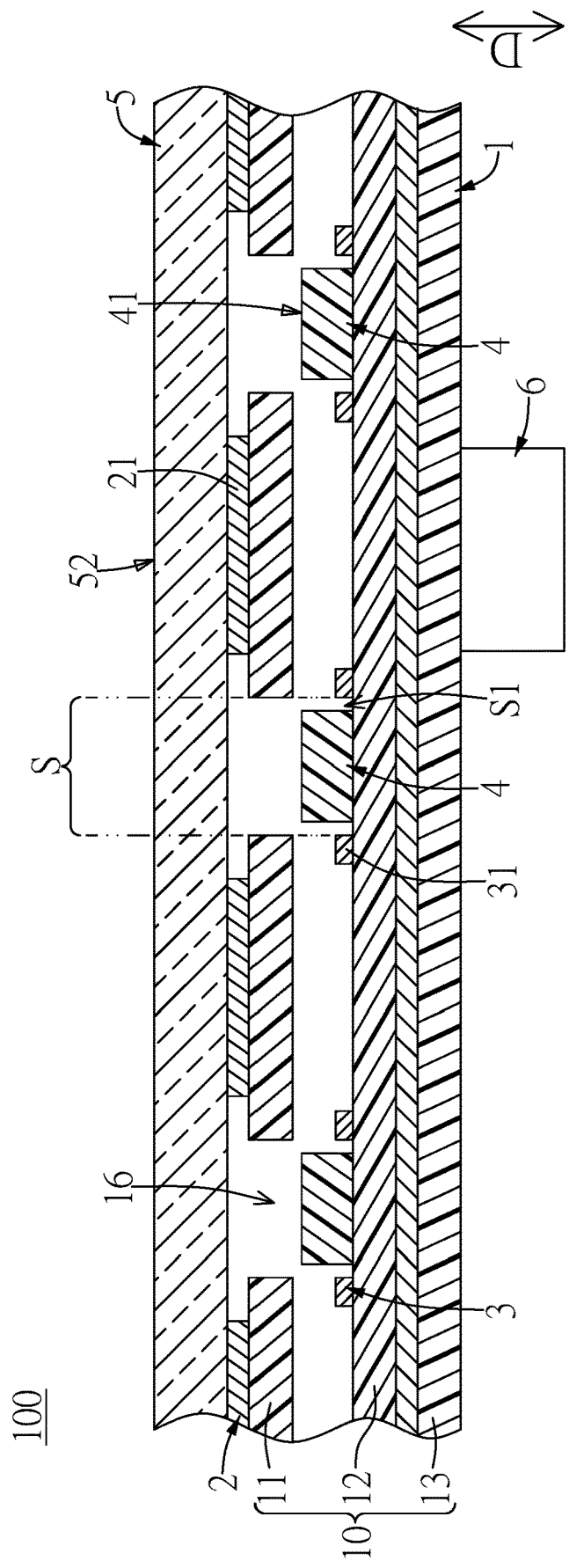
FIG. 9 is a cross-sectional view taken along line IX-IX of FIG. 8.

Referring to FIG. 8 and FIG. 9, a fourth embodiment of the present disclosure is similar to the third embodiment of the present disclosure. For the sake of brevity, descriptions of the same components in the third and fourth embodiments of the present disclosure will be omitted herein, and the following description only discloses different features between the third and fourth embodiments.

In the present embodiment, the substrates 10 arranged in a direction away from the protective layer 5 are spaced apart from each other and are sequentially defined as a second substrate 12, a first substrate 11, and a third substrate 13, but the present disclosure is not limited thereto. Moreover, the driving electrodes 31 and the LED dies 4 are jointly disposed on one of the substrates 10 (e.g., the second substrate 12), and the sensing electrodes 21 are disposed on another one of the substrates 10 (e.g., the first substrate 11) that is other than the second substrate 12.

Specifically, the protective layer 5 covers (or is disposed on) the sensing electrodes 21, the first substrate 11 has a plurality of thru-holes 16 that correspond in position to the plurality of distribution space S, and the light emitting end surface 41 of any one of the LED dies 4 faces toward one of the thru-holes 16. Accordingly, a surface of the protective layer 5 (e.g., a bottom surface of the protective layer 5 shown in FIG. 7) facing the substrate module 1 (e.g., the first substrate 11) can be flat, thereby effectively reducing difficulty of manufacturing the protective layer 5.

Fifth Embodiment

Figure 10:
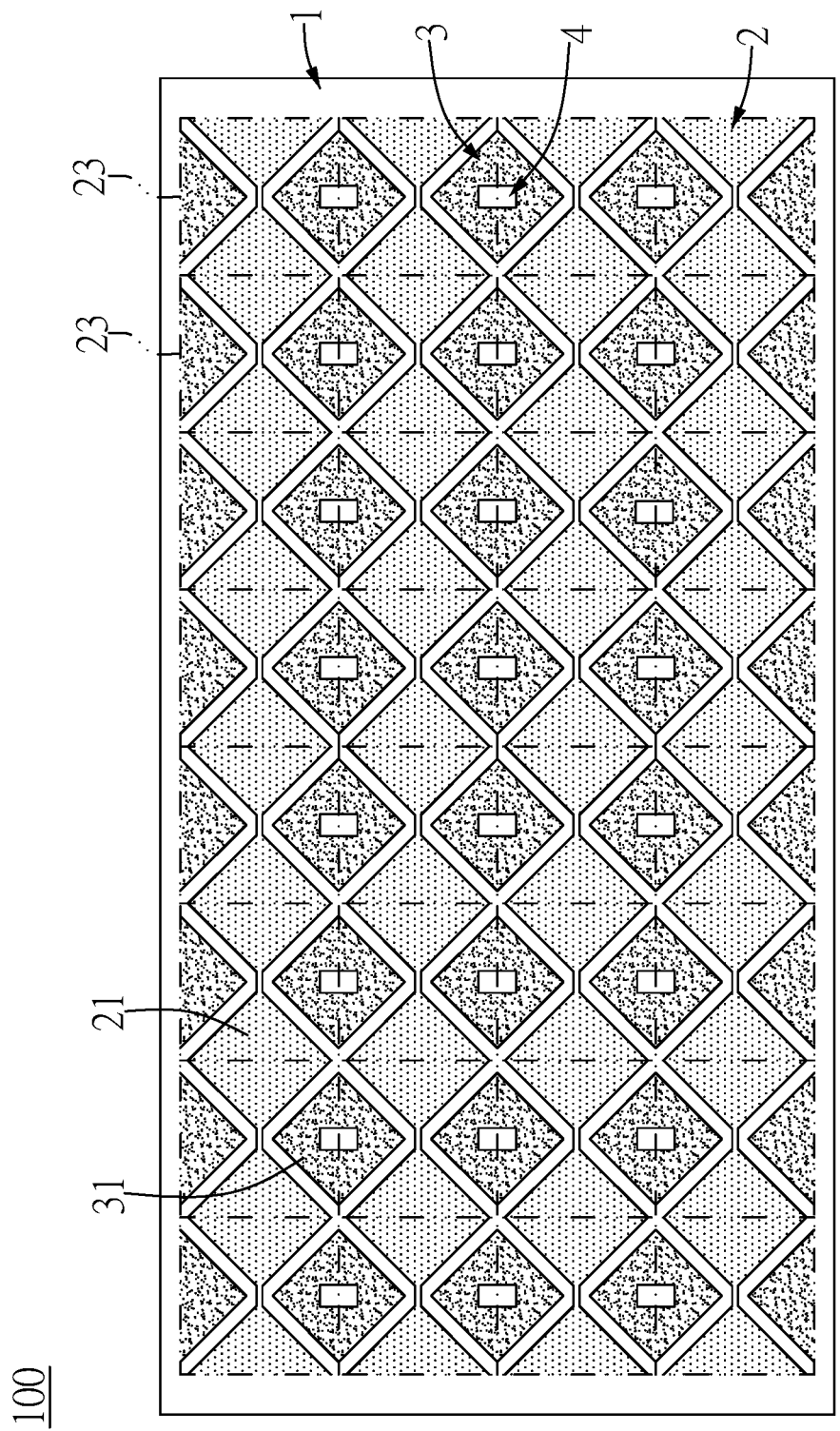
FIG. 10 is a schematic top view of a capacitive touchpad according to a fifth embodiment of the present disclosure.

Referring to FIG. 10, a fifth embodiment of the present disclosure is provided. As shown in FIG. 10, the present embodiment provides a capacitive touchpad 100, which includes a substrate module 1, a sensing electrode layer 2, a driving electrode layer 3 and a plurality of light-emitting diode (LED) dies 4. The sensing electrode layer 2 includes a plurality of sensing electrodes 21 formed on the substrate module 1, and the driving electrode layer 3 includes a plurality of driving electrodes 31 formed on the substrate module 1.

The plurality of sensing electrodes 21 and the plurality of driving electrodes 31 can be respectively disposed on two different substrates in the substrate module 1 as in the above-mentioned first embodiment or fourth embodiment, or can be disposed on the same substrate in the substrate module 1 as in the above-mentioned second embodiment or third embodiment. Furthermore, a plurality of the sensing electrodes 21 and a plurality of the driving electrodes 31 are arranged alternately with one other, and it should be understood that the plurality of the sensing electrodes 21 and the plurality of the driving electrodes 31 form a touch sensing region of the capacitive touchpad 100.

In China Patent Publication No. CN110568942A, a touch sensing region is divided into a plurality of first sensing units and a plurality of second sensing units in order to provide a touchpad with a function of light emission. Compared with the first sensing units, the second sensing units each lacks an area for arranging a light-emitting diode chip. Therefore, under the same touch condition, a sensing value generated by each of the second sensing units is smaller than a sensing value generated by each of the first sensing units, such that the sensing value of each of the second sensing units needs to be compensated in Chinese Patent Publication No. CN110568942A.

Compared with the Chinese Patent Publication No. CN110568942A, the touch sensing region is divided into a plurality of sensing units 23 having the same area in the present embodiment. That is, under the same touch condition, a plurality of the sensing units 23 have the same sensing values, and the sensing value of one of the sensing units 23 is related to a capacitance change between the sensing electrodes 21 and the driving electrodes 21 covered by the one of the sensing units 23.

In addition, the LED dies 4 are mounted on the substrate module 1. Each of the LED dies 4 is arranged in (or across) two adjacent ones of the sensing units 23, and a position of each of the LED dies 4 corresponds to a position of one of the driving electrodes 31. Further, a position of each of the LED dies 4 does not change a length of an adjacent edge between the corresponding one of the driving electrodes 31 and the corresponding one of the sensing electrodes 21. Therefore, under the same touch condition, each of the LED dies 4 does not change the sensing value of the corresponding one of the sensing units 23.

In order to prevent the LED chip 4 from affecting the capacitance change between the sensing electrode 21 and the driving electrode 31, a structure of the present embodiment can be similar to the first embodiment, the second embodiment, the third embodiment or the fourth embodiment, thus details thereof will be omitted herein. Accordingly, in the capacitive touchpad 100, the sensing value of any one of the sensing units 23 does not need to be compensated, and whether the touch sensing region is touched by a conductor (such as a stylus or a finger) and a location of the touch can be determined directed according to the sensing value of each of the sensing units 23.

Sixth Embodiment

Figure 11:
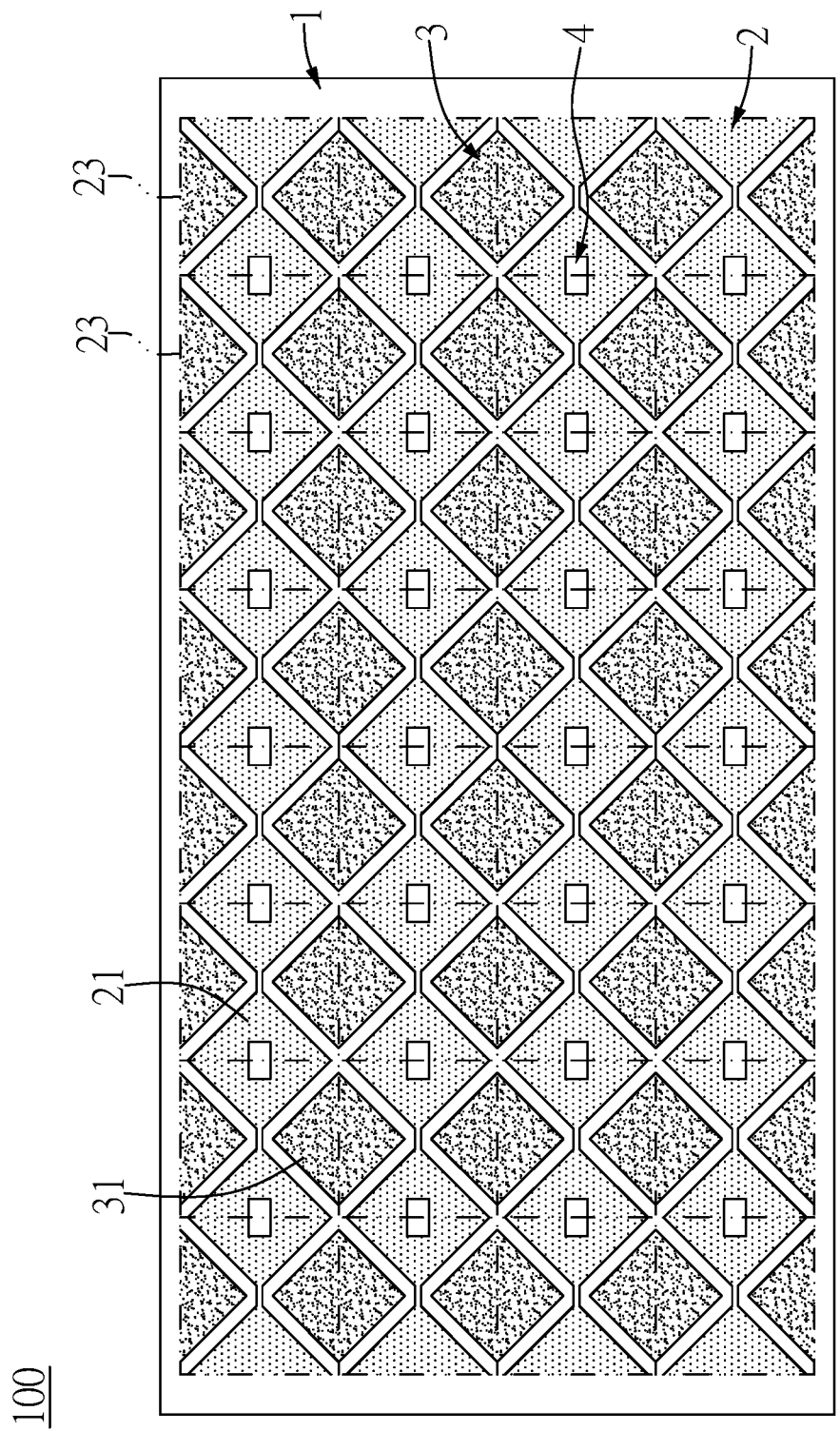
FIG. 11 is a schematic top view of a capacitive touchpad according to a sixth embodiment of the present disclosure.
Figure 12:
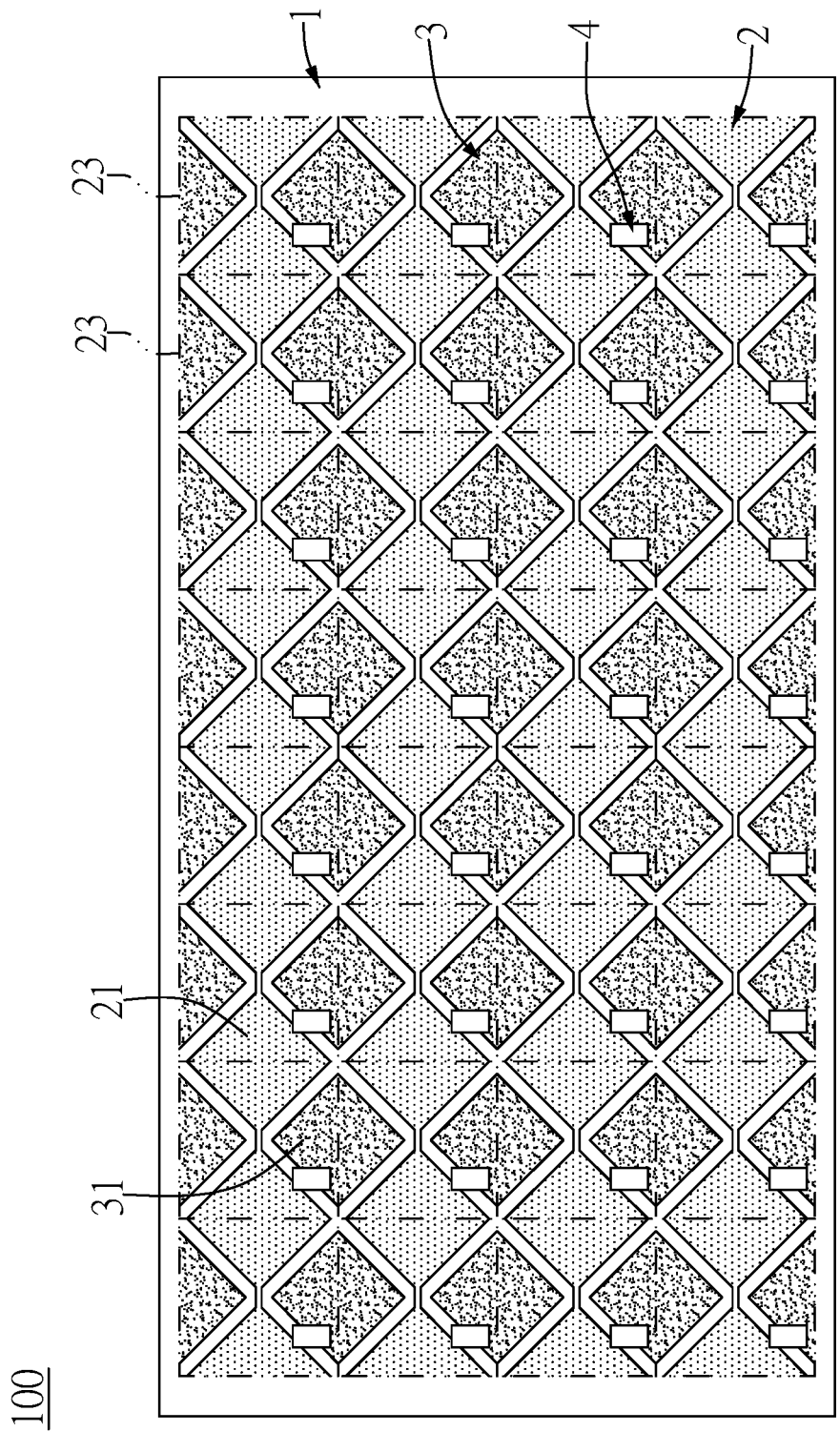
FIG. 12 is a schematic top view of a capacitive touchpad according to a seventh embodiment of the present disclosure.

Referring to FIG. 11, a sixth embodiment of the present disclosure is similar to the fifth embodiment of the present disclosure. For the sake of brevity, descriptions of the same components in the fifth and sixth embodiments of the present disclosure will be omitted herein, and the following description only discloses different features between the fifth and sixth embodiments.

In this embodiment, each of the LED dies 4 is arranged in (or across) two adjacent ones of the sensing units 23, and a position of each of the LED dies 4 corresponds to a position of one of the sensing electrodes 21.

Specifically, since the position of each of the LED dies 4 is changed from corresponding to one of the driving electrodes 31 in the fifth embodiment to corresponding to one of the sensing electrodes 21, a structural design of this embodiment can similarly be provided by exchanging the sensing electrode layer 2 with the driving electrode layer 3 in FIG. 2, FIG. 6, FIG. 7 or FIG. 9. Therefore, since the plurality of LED dies can be electrically isolated from the sensing electrodes 21 and the driving electrodes 31, a capacitance change between the sensing electrodes 21 and the driving electrodes 31 is unaffected by each of the LED dies 4 in the present embodiment, either.

For example, in a case that the structural design of the present embodiment is provided by exchanging the sensing electrode layer 2 and the driving electrode layer 3 in FIG. 2, the LED dies 4 and the driving electrodes 31 are jointly disposed on the first substrate 11 of the substrate module 1, and the sensing electrodes 21 are disposed on the second substrate 12 of the substrate module 1. Furthermore, a plurality of distribution spaces S extending from the sensing electrodes 21 along the normal direction D are defined in the present embodiment, and the driving electrodes 31 are arranged outside of the distribution spaces S.

Each of the LED dies 4 is located in one of the distribution spaces S, and none of the driving electrodes 31 are shielded by the LED dies 4 along the normal direction D. Since the sensing electrode layer 2 and the driving electrode layer 3 are merely exchanged without departing from a concept of FIG. 2, those skilled in the art should understand other details from the content of the above-mentioned first embodiment, thus details thereof will be omitted herein.

On the contrary, in a case that the structural design of the present embodiment is provided by exchanging the sensing electrode layer 2 and the driving electrode layer 3 in FIG. 6, the sensing electrodes 21, the driving electrodes 31 and the LED dies 4 are jointly disposed on the first substrate 11 of the substrate module 1, and each of the sensing electrodes 21 surrounds to form one of a plurality of distribution regions 51. In addition, a plurality of distribution spaces S extending from the distribution regions 51 along the normal direction D are defined in the present embodiment.

Each of the LED dies 4 is located in one of the distribution spaces S, and none of the driving electrodes 31 are shielded by the LED dies 4 along the normal direction D. For instance, each of the driving electrodes 31 forms a rectangular frame, and any one of the LED dies can be disposed within a hollow portion defined by the rectangular frame, such that the rectangular frame can surround the corresponding LED die 4. That is, any one of the LED dies 4 is surrounded by one of the sensing units 21. Since the sensing electrode layer 2 and the driving electrode layer 3 are merely exchanged without departing from a concept of FIG. 6, those skilled in the art should understand other details from the content of the above-mentioned second embodiment, thus details thereof will be omitted herein.

On the contrary, in a case that the structural design of the present embodiment is provided by exchanging the sensing electrode layer 2 and the driving electrode layer 3 in FIG. 7, the driving electrodes 31 and the sensing electrodes 21 are jointly disposed on the first substrate 11 of the substrate module 1, and the LED dies 4 are disposed on the second substrate 12 of the substrate module 1. In addition, each of the sensing units 21 surrounds to form one of the distribution regions 51, and a plurality of distribution spaces S extending from the distribution regions 51 along the normal direction D are defined in the present embodiment.

The first substrate 11 has a plurality of thru-holes 16 that correspond in position to the plurality of distribution space S, and the light emitting end surface 41 of any one of the LED dies 4 faces toward one of the thru-holes 16. Since the sensing electrode layer 2 and the driving electrode layer 3 are merely exchanged without departing from a concept of FIG. 7, those skilled in the art should understand other details from the content of the above-mentioned third embodiment, thus details thereof will be omitted herein.

On the contrary, in a case that the structural design of the present embodiment is provided by exchanging the sensing electrode layer 2 and the driving electrode layer 3 in FIG. 9, the driving electrodes 31 are jointly disposed on the first substrate 11 of the substrate module 1, and the sensing electrodes 21 and the LED dies 4 are disposed on the second substrate 12 of the substrate module 1. In addition, each of the sensing units 21 surrounds to form one of the distribution regions S 1, and a plurality of distribution spaces S extending from the distribution regions Si along the normal direction D are defined in the present embodiment.

The first substrate 11 has a plurality of thru-holes 16 that correspond in position to the plurality of distribution space S, and the light emitting end surface 41 of any one of the LED dies 4 faces toward one of the thru-holes 16. Since the sensing electrode layer 2 and the driving electrode layer 3 are merely exchanged without departing from a concept of FIG. 9, those skilled in the art should understand other details from the content of the above-mentioned fourth embodiment, thus details thereof will be omitted herein.

Seventh Embodiment

Referring to FIG. 11, a seventh embodiment of the present disclosure is similar to the fifth and sixth embodiments of the present disclosure. For the sake of brevity, descriptions of the same components in the fifth, sixth and seventh embodiments of the present disclosure will be omitted herein, and the following description only discloses different features between the fifth and sixth embodiments and the seventh embodiment.

In this embodiment, each of the LED dies 4 is placed in one of the sensing units 23, and a position of each of the LED dies 4 corresponds to a boundary between one of the sensing electrodes 21 and one of the driving electrodes 31.

Specifically, in this embodiment, the LED dies 4 are disposed on the first substrate 11 of the substrate module 1, and the sensing electrodes 21 and the driving electrodes 31 are jointly disposed on the first substrate 11 of the substrate module 1, or the sensing electrodes 21 and the driving electrodes 31 are disposed on the second substrate 12 and the third substrate 13, respectively. Accordingly, in the present embodiment, the LED chip 4 merely slightly affects a capacitance change between the sensing electrodes 21 and the driving electrodes 31, such that the capacitive touchpad 100 does not need a gap (without sensing unit) for arranging one of the LED chip 4.

Eighth Embodiment

Figure 13:
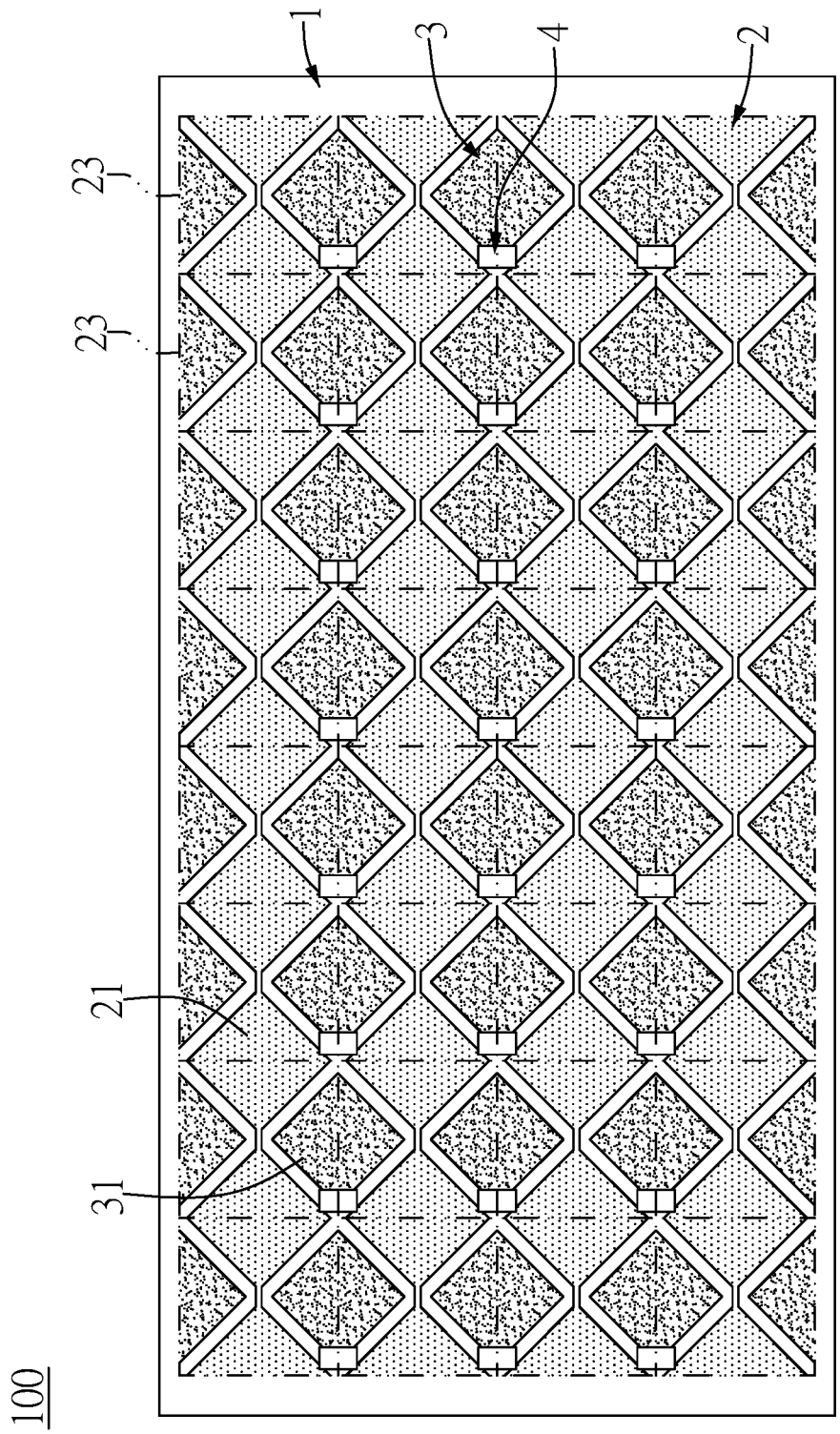
FIG. 13 is a schematic top view of a capacitive touchpad according to an eighth embodiment of the present disclosure.

Referring to FIG. 13, an eighth embodiment of the present disclosure is similar to the seventh embodiment of the present disclosure. For the sake of brevity, descriptions of the same components in the seventh and eighth embodiments of the present disclosure will be omitted herein, and the following description only discloses different features between the seventh and eighth embodiments.

In this embodiment, each of the LED dies 4 is arranged in (or across) two adjacent ones of the sensing units 23, and a position of each of the LED dies 4 corresponds to a boundary between one of the sensing electrodes 21 and one of the driving electrodes 31.

Beneficial Effects of the Embodiments

In conclusion, in the capacitive touchpad provided by the present disclosure, through cooperation of the LED dies and other components of the present disclosure (e.g., each of the LED dies being located in one of the distribution spaces and the LED dies not shielding any one of the sensing electrodes along the normal direction), a touch control effect of the capacitive touchpad provided by the present disclosure can avoid being affected by a position of any one of the LED dies, and subtle changes in partial optical performances of the capacitive touchpad can be provided.

Moreover, due to the structural design of each of the driving electrodes (e.g., each of the driving electrodes is formed to surroundingly define one of a plurality of distribution regions, and the driving electrode layer defines a distribution space that extends from the distribution regions along the normal direction), the sensing electrodes, the driving electrodes, and the LED dies in the capacitive touchpad provided by the present disclosure can be jointly disposed on the same substrate, so that a thickness of the capacitive touchpad can be effectively reduced.

In addition, the LED dies in the capacitive touchpad provided by the present disclosure can be disposed on the substrate away from the protective layer, so that the protective layer does not need to cover any one of the LED dies, thereby effectively reducing a difficulty of manufacturing the protective layer.

On the other hand, in the capacitive touchpad provided by the present disclosure, the touch sensing region formed by the sensing electrodes and the driving electrodes is divided into the sensing units having the same area, and through the above-mentioned various specific embodiments, the LED dies can be arranged in the sensing units (e.g., arranged in two adjacent sensing units), and the position of each of the LED dies corresponds to a position of one of the driving electrodes or one of the sensing electrodes without affecting the capacitance change between the sensing electrodes and the driving electrodes, and there is no need to compensate the sensing value generated by any one of the sensing units.

Further, the capacitive touchpad provided by the present disclosure can be particularly suitable for touch keyboards, that is, a plurality of keycaps can be provided on the capacitive touchpad, and one of the sensing units of the capacitive touchpad can correspond to one of the keycaps. When one of the keycaps is touched, the LED dies in the corresponding one or more of the sensing units can emit light accordingly.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A capacitive touchpad, comprising:
   a substrate module, wherein the substrate module defines a normal direction, and the substrate module includes a plurality of substrates arranged along the normal direction;
   a sensing electrode layer including a plurality of sensing electrodes formed on the substrate module;
   a driving electrode layer including a plurality of driving electrodes formed on the substrate module, wherein the plurality of sensing electrodes and the plurality of driving electrodes form a touch sensing region of the capacitive touchpad; and
   a plurality of light-emitting diode (LED) dies mounted on the substrate module, wherein the plurality of sensing electrodes and the LED dies are jointly disposed on one of the plurality of substrates that is defined as a first substrate, a position of each of the LED dies corresponds to a position of one of the plurality of driving electrodes, and the plurality of LED dies are electrically isolated from the plurality of sensing electrodes and the plurality of driving electrodes;
   wherein the plurality of sensing electrodes, the plurality of driving electrodes and the plurality of LED dies are jointly disposed on the first substrate, and wherein any one of the plurality of LED dies is surrounded by one of the driving electrodes and is located in the distribution region defined by the one of the driving electrodes.

2. The capacitive touchpad according to claim 1, wherein the touch sensing region is divided into a plurality of sensing units, each of the sensing units is an area of a plurality of areas of the touch sensing region having the same area, and each of the LED dies is arranged in two adjacent ones of the plurality of sensing units; wherein the plurality of sensing electrodes define a layout pattern having a plurality of hollow spaces, and the plurality of the LED dies are disposed in the plurality of hollow spaces.

3. The capacitive touchpad according to claim 1, wherein the touch sensing region is divided into a plurality of sensing units, each of the sensing units is an area of a plurality of areas of the touch sensing region having the same area, and each of the LED dies is arranged in two adjacent ones of the plurality of sensing units; wherein each of the plurality of driving electrodes is formed to surroundingly define one of a plurality of distribution regions, and the driving electrode layer defines a plurality of distribution spaces extending from the plurality of distribution regions along the normal direction; wherein each of the LED dies is located in one of the plurality of distribution spaces, and none of the sensing electrodes are shielded by the plurality of the LED dies along the normal direction.

4. A capacitive touchpad, comprising:
- a substrate module, wherein the substrate module defines a normal direction, and the substrate module includes a plurality of substrates arranged along the normal direction;
- a sensing electrode layer including a plurality of sensing electrodes formed on the substrate module;
- a driving electrode layer including a plurality of driving electrodes formed on the substrate module, wherein the plurality of sensing electrodes and the plurality of driving electrodes form a touch sensing region of the capacitive touchpad; and
- a plurality of light-emitting diode (LED) dies mounted on the substrate module, wherein the plurality of driving electrodes and the plurality of LED dies are jointly disposed on one of the plurality of substrates that is defined as a first substrate, a position of each of the LED dies corresponds to a position of one of the plurality of sensing electrodes, and the plurality of LED dies are electrically isolated from the plurality of sensing electrodes and the plurality of driving electrodes;
- wherein the plurality of sensing electrodes, the plurality of driving electrodes and the plurality of LED dies are jointly disposed on the first substrate, and wherein any one of the plurality of LED dies is surrounded by one of the plurality of sensing electrodes and is located in the distribution region defined by the one of the sensing electrodes.

5. The capacitive touchpad according to claim 4, wherein the touch sensing region is divided into a plurality of sensing units, each of the sensing units is an area of a plurality of areas of the touch sensing region having the same area, and each of the LED dies is arranged in two adjacent ones of the plurality of sensing units; wherein the plurality of driving electrodes define a layout pattern having a plurality of hollow spaces, and the plurality of the LED dies are disposed in the plurality of hollow spaces.

6. The capacitive touchpad according to claim 4, wherein the touch sensing region is divided into a plurality of sensing units, each of the sensing units is an area of a plurality of areas of the touch sensing region having the same area, and each of the LED dies is arranged in two adjacent ones of the plurality of sensing units; wherein each of the plurality of sensing electrodes is formed to surroundingly define one of a plurality of distribution regions, and the sensing electrode layer defines a plurality of distribution spaces extending from the plurality of distribution regions along the normal direction; and
- wherein each of the LED dies is located in one of the plurality of distribution spaces, and none of the sensing electrodes are shielded by the plurality of the LED dies along the normal direction.

* * * * *